United States Patent
Tamura et al.

(10) Patent No.: US 7,258,586 B2
(45) Date of Patent: Aug. 21, 2007

(54) METHOD FOR MANUFACTURING AN ORGANIC ELECTROLUMINESCENCE DISPLAY

(75) Inventors: Takuo Tamura, Yokohama (JP); Mikio Hongo, Yokohama (JP); Masaaki Okunaka, Fujisawa (JP); Shinichi Kato, Mobara (JP); Eiji Matsuzaki, Yokohama (JP); Masato Ito, Koganei (JP); Masatomo Terakado, Chiba (JP)

(73) Assignee: Hitachi Displays, Ltd., Chiba-ken (JP)

( * ) Notice: Subject to any disclaimer, the term of this patent is extended or adjusted under 35 U.S.C. 154(b) by 289 days.

(21) Appl. No.: 10/878,550

(22) Filed: Jun. 29, 2004

(65) Prior Publication Data

US 2005/0215163 A1    Sep. 29, 2005

(30) Foreign Application Priority Data

Mar. 24, 2004 (JP) .............................. 2004-087527

(51) Int. Cl.
*H01J 9/00*   (2006.01)
(52) U.S. Cl. .............................. 445/24; 445/5; 445/61; 445/2; 349/54; 349/55; 438/4
(58) Field of Classification Search .................. 445/24, 445/2, 5, 61; 349/192, 54–55; 438/4
See application file for complete search history.

(56) References Cited

U.S. PATENT DOCUMENTS

| | | | |
|---|---|---|---|
| 5,017,755 A * | 5/1991 | Yahagi et al. ........... | 219/121.68 |
| 2003/0222861 A1* | 12/2003 | Nishikawa et al. ......... | 345/204 |
| 2004/0246433 A1* | 12/2004 | Chen .......................... | 349/192 |

FOREIGN PATENT DOCUMENTS

| | | |
|---|---|---|
| JP | 2000-195677 | 12/1998 |
| JP | 2001-118684 | 10/1999 |
| JP | 2001-176672 | 12/1999 |
| JP | 2000231121 A * | 8/2000 |
| JP | 2002303860 A * | 10/2002 |

* cited by examiner

*Primary Examiner*—Joseph Williams
*Assistant Examiner*—Hana Asmat Sanei
(74) *Attorney, Agent, or Firm*—Reed Smith, LLP; Stanley P. Fisher, Esq.; Juan Carlos A. Marquez, Esq.

(57) ABSTRACT

When any of pixels is not lit in an organic EL display having an organic EL layer between a first electrode and a second electrode, an organic layer of the pixel is observed. If the organic layer of the pixel contains foreign matter, the second electrode is separated into a region in contact with the foreign matter and a region not in contact with both the contact region and the foreign matter. Thus, not-lit display regions are reduced as less as possible, making it possible to manufacture an organic EL display excellent in display performance.

10 Claims, 10 Drawing Sheets

Cross sectional view along B-B

Plan view

Cross sectional view along A-A

Plan view

Cross sectional view along B-B

300A

300C

300D (1)

(2)

(3)

(4)

Laser wavelength: 355nm

Laser wavelength: 532nm

METHOD FOR MANUFACTURING AN ORGANIC ELECTROLUMINESCENCE DISPLAY

BACKGROUND OF THE INVENTION

The present invention relates to a technique for manufacturing an organic electroluminescence (EL) display and, more in particular, it relates to a method for manufacturing an organic electroluminescence display excellent in display performance with efficiency.

If foreign matter is contained in an organic light emission layer of an organic EL device, defective pixels (pixels of defective emission, pixels with no emission, etc.), sometimes occur due to short-circuit between electrodes (metal electrodes, transparent electrodes) sandwiching the organic light emission layer. Techniques described in Patent Documents 1 and 2 have been known as a technique for restoring such defective pixels.

According to the technique described in Patent Document 1, a region causing shortcircuit or the like is removed by laser from metal electrodes corresponding to a defective pixel. Since this enables the organic light emission layer between a partially removed metal electrode and a transparent electrode to emit light favorably, the defective pixels are restored.

Further, according to the technique described in Patent Document 2, each of pixels is divided into a plurality of pixel elements and, among the pixel elements constituting defective pixels, only the metal electrode of a pixel element containing a portion causing short-circuit is removed by laser. This can restore the defective pixel with no effects on pixel elements other than the pixel element containing a short-circuited portion.

[Patent Document 1]
Japanese Patent Laid-open No. 2001-118684

[Patent Document 2]
Japanese Patent Laid-open No. No. 2000-195677

SUMMARY OF THE INVENTION

In the technique described in Patent Document 2, every pixel has to be separated into a plurality of pixel elements in a thin film pattern. Since this requires an additional step, the steps for manufacturing an organic EL display device are complicated.

On the other hand, according to the technique described in Patent Document 1, since foreign matter is directly irradiated with laser, it causes abrasion to possibly contaminate the organic light emission layer. Such contamination possibly causes lowering of the display performance (for example, optical characteristics such as luminance and device life) of the organic display device.

In view of the above, an object of the present invention is to provide a method for manufacturing a video display, which can efficiently manufacture an organic EL display excellent in display performance.

According to an aspect of the present invention, there is provided a method for manufacturing an organic electroluminescence display having an organic film and first and second electrode layers, the first and second electrode layers facing each other to interpose the organic film therebetween and allow the organic film to emit light passing through the first electrode layer. The method comprises the steps of: inspecting whether the organic film emits light or not and, if the organic film does not emit light, detecting foreign matter in the organic film from a side of the first electrode layer; and irradiating, if the foreign matter is detected, the second electrode layer with a laser beam capable of transmitting the first electrode layer and the organic film by way of an optical path not containing the foreign matter, so as to remove a band-like region surrounding a periphery of the foreign matter from the second electrode layer.

According to the invention, an organic EL display excellent in display performance can be manufactured efficiently.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

A preferred embodiment according to the present invention will below be described with reference to the accompanying drawings.

At first, a description is to be made of manufacturing steps for an organic EL display according to the embodiment with reference to an example of a bottom emission type organic EL display as an object of manufacture.

Figure 1:
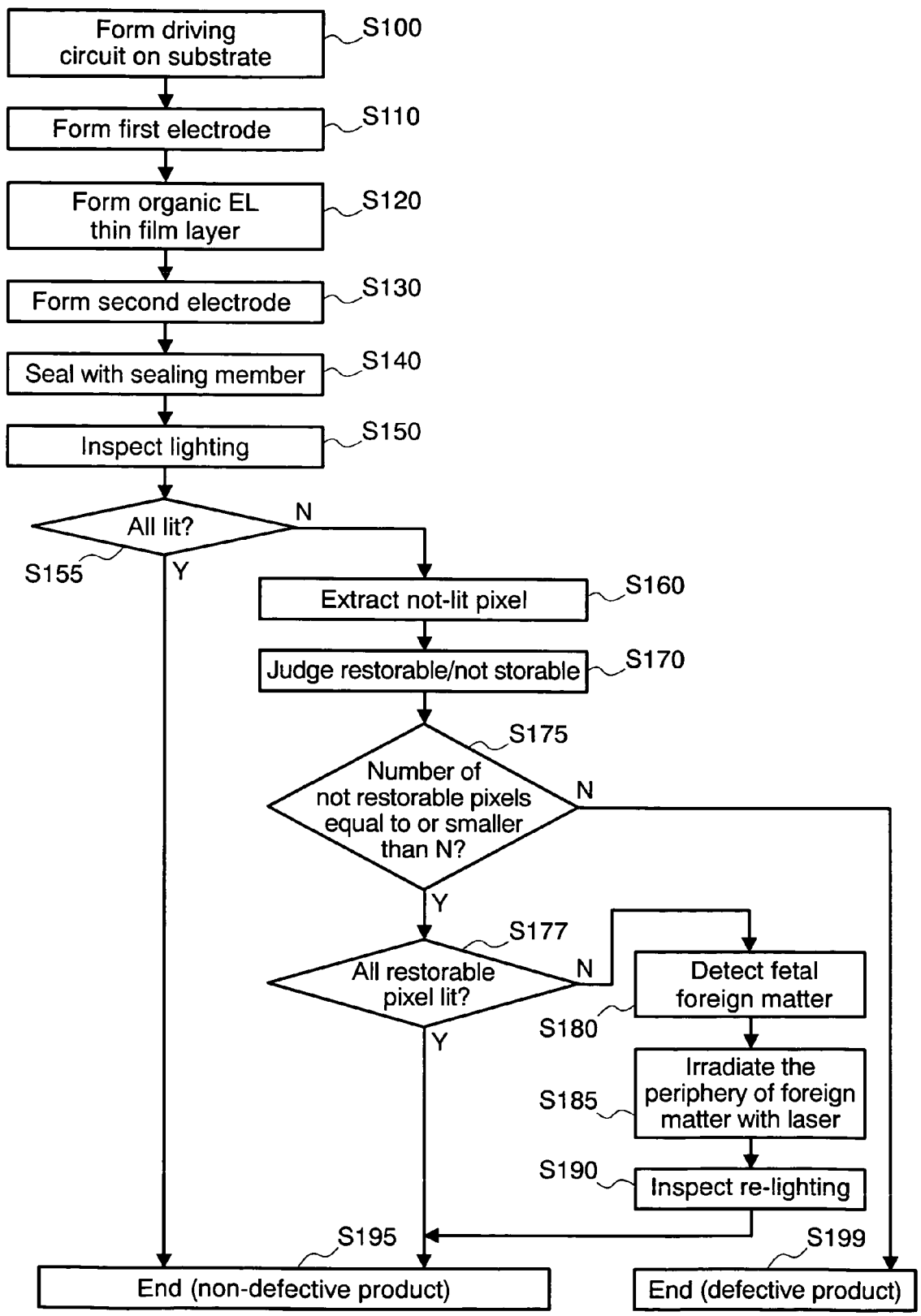
FIG. 1 is a flow chart of manufacturing steps for an organic EL display for explaining a preferred embodiment of the invention.
Figure 2A:
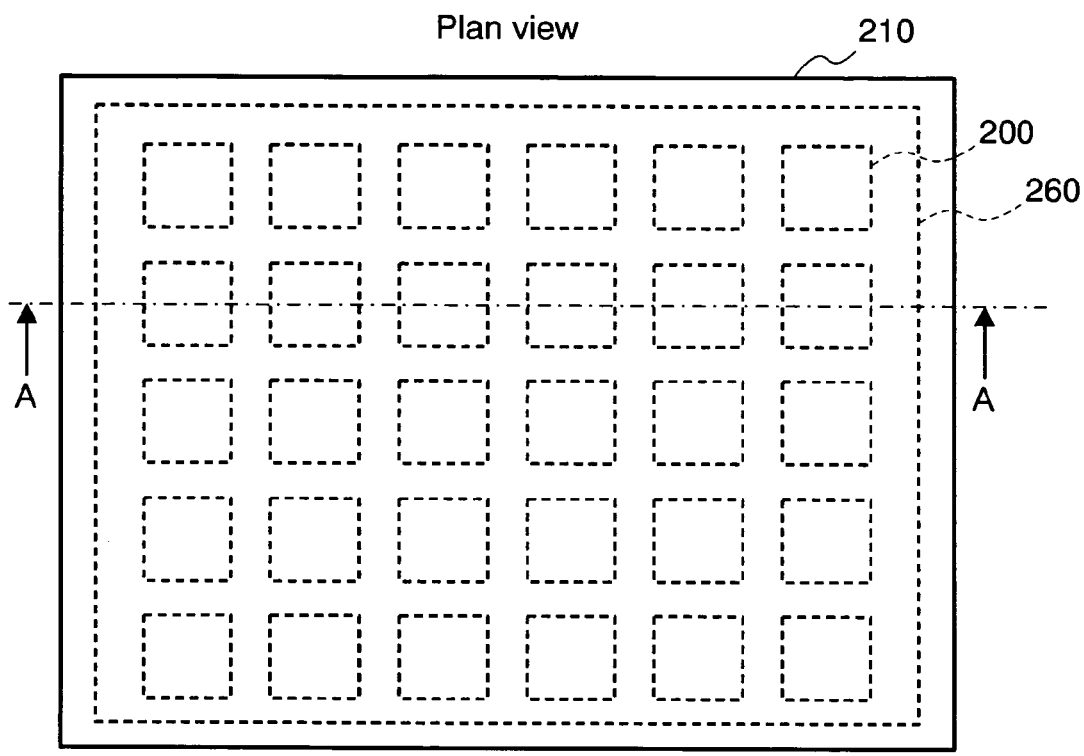
FIG. 2A is a plan view of the organic EL display according to the embodiment of the invention.
Figure 2B:
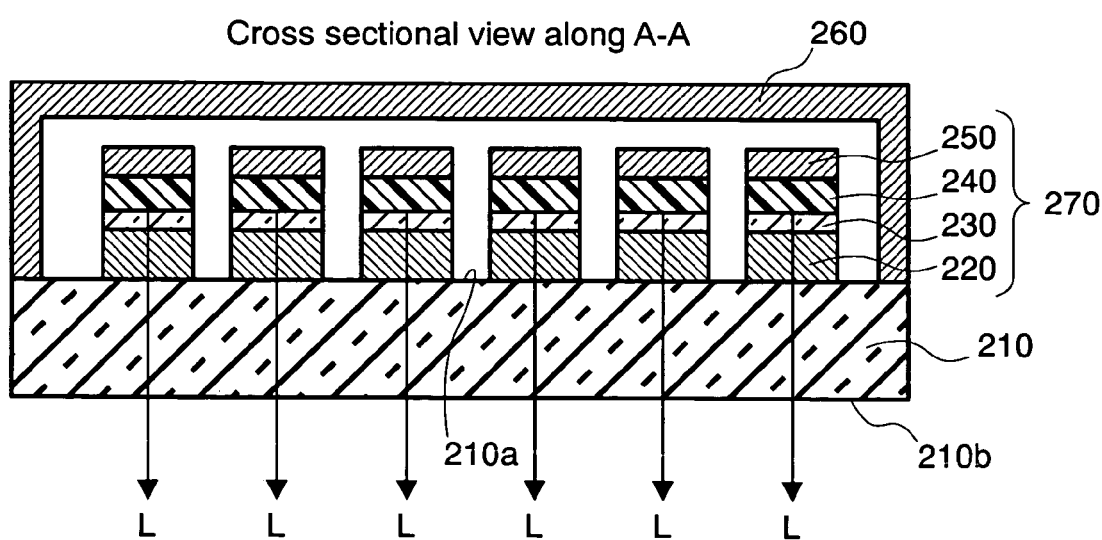
FIG. 2B is a cross sectional view taken along line A-A in the plan view of the organic EL display.

FIG. 1 is a schematic flow chart of steps for manufacturing an organic EL display according to this embodiment. FIG. 2A is a plan view of an organic EL manufactured by the manufacturing steps and FIG. 2B is a cross sectional view taken along line A-A of FIG. 2A.

At first, driving circuit layers 220 for driving pixel are formed respectively in a plurality of pixel regions 200 defined as a matrix in one surface (hereinafter referred to as rearface) 210a of a glass substrate 210 (S100). First electrodes 230 optically transparent in a visible light region are respectively deposited on the driving circuit layers 220 (S110).

Then, organic El thin films 240 are respectively deposited on the first electrodes 230, and metal films not transparent in the visible light region are deposited as second electrodes 250 on the thin organic EL films 240, respectively. (S130).

In each of the stacked films 270 formed as described above, when a DC current is supplied between the first and the second electrodes 230 and 250, the thin organic EL film 240 sandwiched between the electrodes 230 and 250 emits light. The light L is taken out on the side of the other surface (hereinafter referred to as surface) 210b of the substrate 210. By the way, when such current supply is conducted in atmospheric air, moistures and contaminants in the atmospheric air intrude into the stacked film 270 to gradually degrade the emission characteristics of the stacked film 270.

In view of the above, to isolate the stacked film 270 from the atmospheric air, the glass substrate 200 is sealed on the side of the rear face 210a by a sealer 260, e.g., a sealing can in a circumstance isolated from the atmospheric air (S140). Thus, an organic EL display panel is completed.

Then, under a predetermined inspection environment, a lighting test for the organic EL display panel is carried out in a front elevational view from a predetermined distance (S150).

As a result of the lighting test, if all pixels 200 are lit (S155), the organic EL display panel is judged intact (S195) and then sent to other testing steps such as a performance test.

Figure 7A:
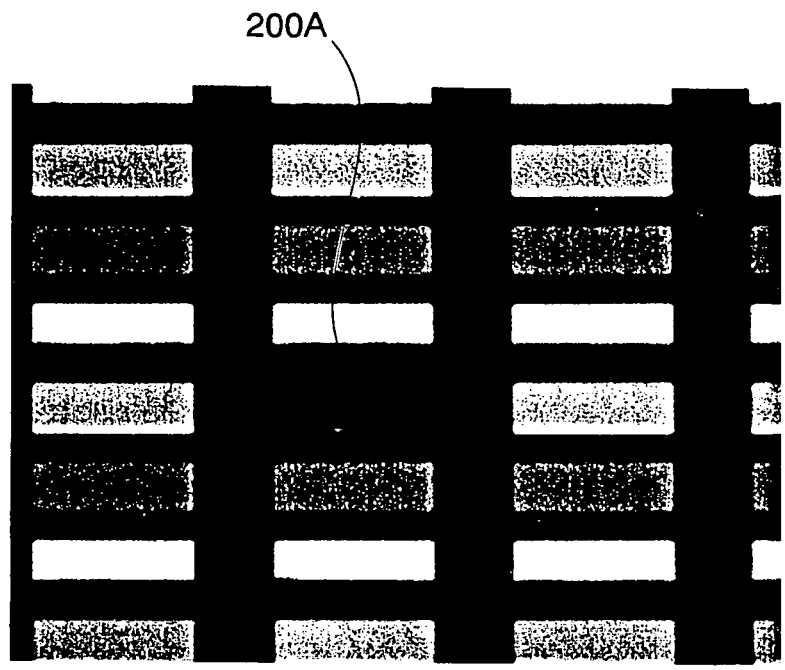
FIG. 7A is a view showing an image of an optical microscopic photograph of a pixel before restoration.

On the other hand, as shown in FIG. 7A, if any one (200a) of the plurality of pixels 200 is not lit, that is, a pixel defect is found (S155), the inside of the organic EL display is observed under an optical microscope from the side of the glass substrate 210 and a not-lit pixel is extracted (S160).

As a result, in a case where the thin organic EL film 240 at the not-lit pixel 200A contains foreign matter 300, it is judged that the pixel 200A can be restored by the laser beam and, in other cases than described above, it is judged that the pixel 200A cannot be restored by the laser beam (S170).

As described above, the number of restorable pixels and the number of not-restorable pixels are counted. As a result, if the number of not-restorable pixels is more than a number N determined by the specification required for products, the organic EL display panel is rejected without pixel restoration by the laser beam (S199). On the contrary, if the number of the not restorable pixels is less than N, pixel restoration by the laser beam is performed on the organic EL display panel.

For example, if the number N of defects to be allowed for the entire organic EL display panel is 4, an organic EL display panel having not-restorable pixels by the number of 4 or more is rejected, whereas an organic EL display panel having not-restorable pixels by the number of less than 4 undergoes pixel restoration by the laser beam.

The pixel restoration by the laser beam is performed as described below.

At first, foreign matter in the restorable pixel is detected (S180). In order to accurately detect the position for the foreign matter in the pixel, this embodiment also uses an image processing system of detecting the position of foreign matter in the pixel by digitalizing output images from a camera that has photographed pixels and image processing the digitalized images.

Then, a laser beam M at a wavelength optically transparent for the glass substrate 210, the driving circuit layer 220 and the first electrode 230 is shaped through a slit into a long rectangular form longer than the diameter d of the foreign matter 300 and then allowed to be incident on the surface 210b of the glass substrate 210 (S185).

Figure 5:
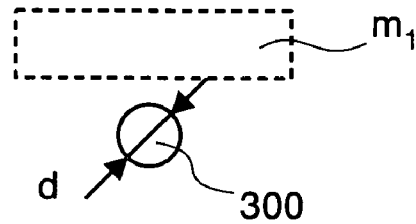
FIG. 5 shows diagrams for explaining a method of irradiating a glass substrate with a laser beam in a pixel restoring treatment according to the embodiment of the invention.
Figure 5:
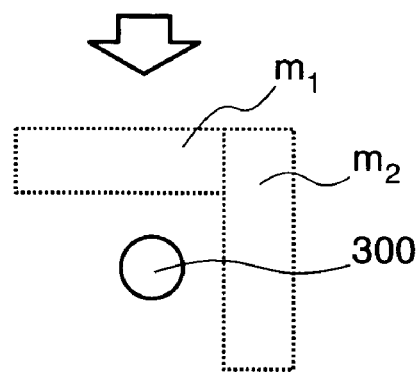
Figure 5:
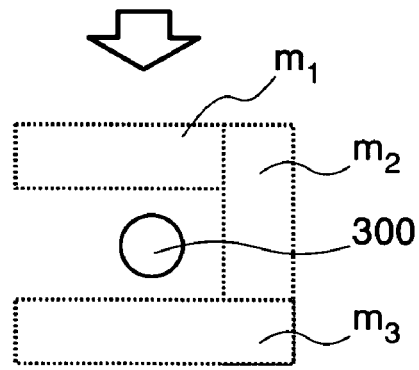
Figure 5:
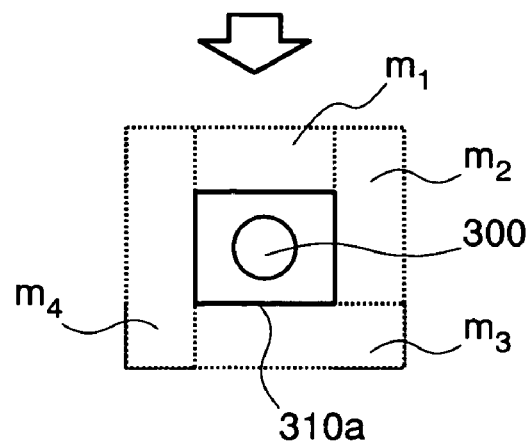

In this case, as shown in FIG. 5, the laser beam M is directed to a region $m_1$ at a position spaced appropriately apart from the position of the outer shape of foreign matter 300 observed from the side of the surface 210(b) of the glass substrate 210 as indicated at (1). For example, if the diameter (d) of the foreign matters 300 is about 5 μm, a laser beam M shaped to about 20 μm long×about 5 μm wide is directed to a square region $m_1$. The square region $m_1$ is defined on the outside of a rectangle 310a having a side of about 10 μm. (The rectangle is an imaginal rectangle defined on the surface 210b of the glass substrate 210 so as to surround the foreign matter 300 observed from the side of the surface 210b of the glass substrate 210 not in contact with the profile thereof.) In addition, the square region $m_1$ has a side comprising the side of the rectangle and two segments each extending from the end of the side of the rectangle at a distance corresponding to the width of the laser beam M.

The laser beam M used herein preferably has a wavelength of higher transmittance for the material used to form the thin organic EL film 240 so that it can transmit through the thin organic EL film 240 and allows the object to be cut (second electrode) to absorb higher energy. This will described be later.

Now, the laser beam M irradiated from the surface 210 of the glass substrate 210 passes through an optical path not containing foreign matter 300 through the glass substrate 210, driving circuit layer 220, first electrode 230 and thin organic EL film 240 and reaches the second electrode 250. As a result, the laser irradiation region of the second electrode 250 is heated instantaneously and removed by the so-called abrasion phenomenon.

Figure 3A:
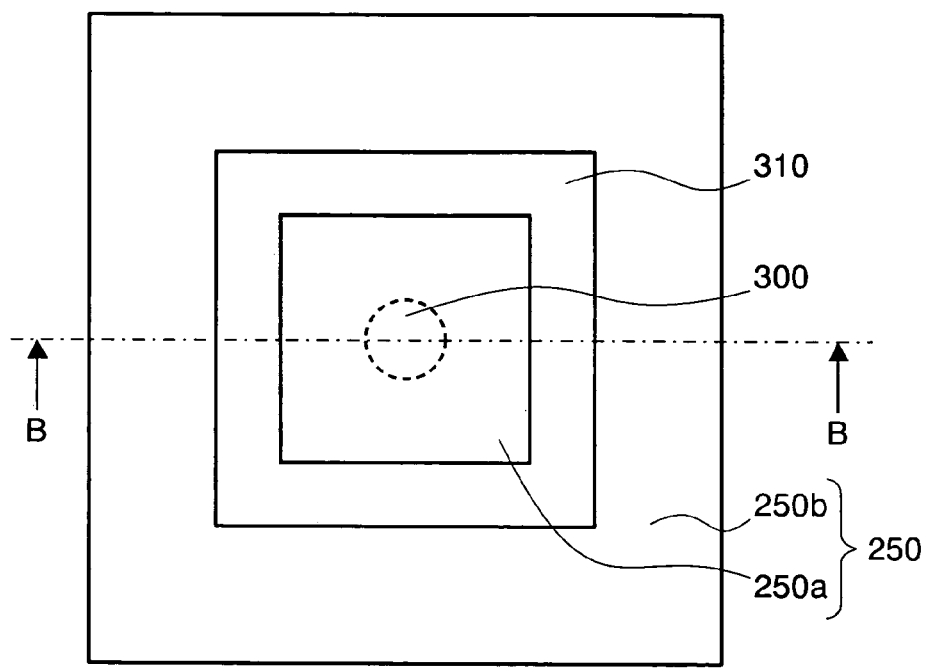
FIG. 3A is a plan view for a stacked film in the organic EL display for explaining the embodiment of the invention.
Figure 3B:
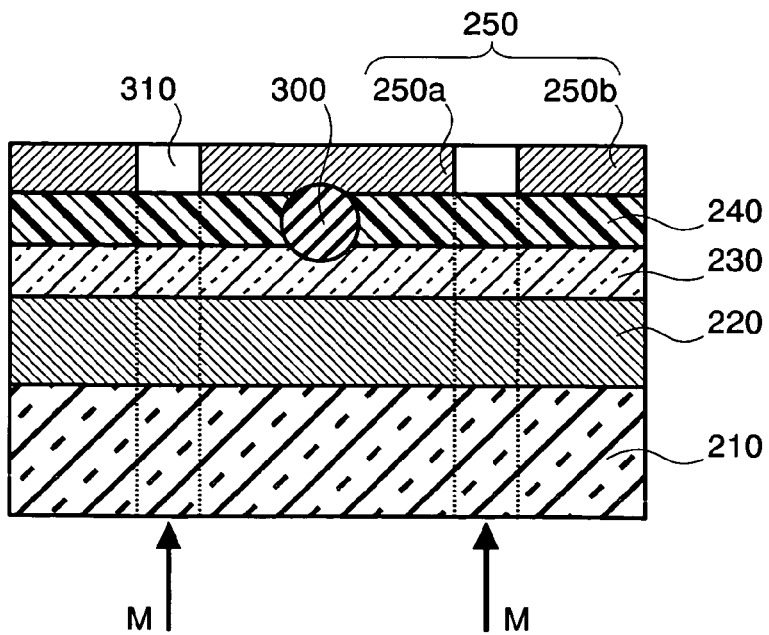
FIG. 3B is a cross sectional view taken along line B-B in the stacked film in the organic EL display.

Then, as shown in FIG. 3, to completely isolate the region 250a in contact with the foreign matter 300 (region short-circuited to the first electrode 230 by the foreign matter 300) from the second electrode 250, the similar rectangular laser beam M is irradiated several times from the side of the surface 210b of the glass substrate 230 such that it is not incident on the foreign matter 300. Specifically, as shown in FIG. 5, a rectangular laser beam M is allowed to be successively incident on rectangular regions $m_2$ to $m_4$ on the outside of the imaginal rectangle 310A and in contact with each of remaining sides of the rectangle 310A, so as to constitute a closed profile completely surrounding the contact point between the foreign matter 300 and the second electrode 250 as indicated at (2) to (4).

Then, as shown in FIG. 3, a band-like region 310 along the profile (outer shape) of a rectangle having a side of about 20 μm that surrounds the foreign matter 300 in a frame like form is removed from the second electrode 250. As a result, a region 250a in contact with the foreign matter 300 narrower than the region 250b is completely isolated in an island shape from the region in not contact with the foreign matter 300 (region not short-circuited with the first electrode 230).

Figure 7B:
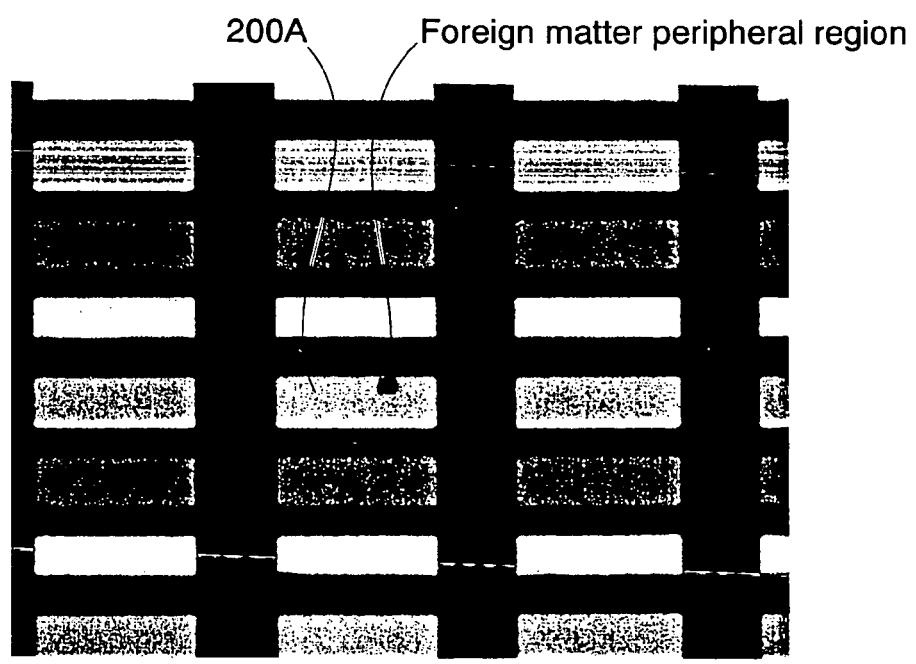
FIG. 7B is a view showing an image of an optical microscopic photograph of a pixel after restoration.

As described above, when the region 250a in contact with the foreign matter 300 is isolated, since the region of the thin organic EL film 240 other than the region where the foreign matter 300 is present (that is, a region put between the region 250b not short-circuited with the first electrode 230, and the first electrode 230) can emit light by the current supply between the remaining region 250b not short-circuited with the first electrode 230, and the first electrode 230, the pixel 200a can be lit as shown in FIG. 7B. In other words, since the pixel defect can be restored, the yield of the products can be improved.

Then, in a predetermined inspection environment, lighting test for the organic EL display is conducted in the front elevational view from a predetermined distance (S190). Processing at S175 to S190 is repeated till it is judged that all the pixels 200 are lit finally (S177). In this way, at the instance all the restorable pixels are lit, the organic EL display panel is judged as an intact product (S195). For the organic EL display panel, other tests such as a performance test are conducted in the same manner as for the organic EL display panel judged to be an intact product as a result of the initial lighting inspection (S150).

According to the manufacturing processing described above, (1) in a case where the foreign matter 300 is present in the organic thin film 240, an island-like region 250a in contact with the foreign matter 300 and a region 250b not in contact with the foreign matter 300 (the region functioning as the second electrode for the restored pixel) are completely isolated from each other by removing only the band-like region 310 completely surrounding the foreign matter 300 from the second electrode 250; therefore, the not-lit pixel can be restored only by the countermeasure for that pixel even when the entire pixels are not divided into the plurality of pixel elements in a thin film pattern. Accordingly, it does not complicate the manufacturing steps for the organic EL display device.

Further, (2) as shown in FIG. 3, since the laser beam M passes only through the peripheral region 320 of the foreign matter 300 and reaches the second electrode 250 while circumventing the foreign matter 300, it is not absorbed to the foreign matter 300 but can cut the second electrode 250 smoothly. Further, (3) since the laser beam M is not incident on foreign matter 300 in the thin organic EL film 240, contamination to the thin organic EL film 240 due to the scattering of the foreign matter 300 can be prevented.

Thus, in the manufacturing step for the organic EL display according to this embodiment, an organic EL display excellent in display performance can be manufactured efficiently.

In the foregoing, foreign matter 300 in contact with both of the first electrode 230 and the second electrode 250 is mentioned as an example of the foreign matter causing the pixel defect; however, foreign matter in a state other than described above may also actually cause formation of current leak path between the first electrode 230 and the second electrode 250. FIG. 4A to FIG. 4D show examples of the state of foreign matters capable of forming the current leak path between the first electrode 240 and the second electrode 250.

Figure 4A:
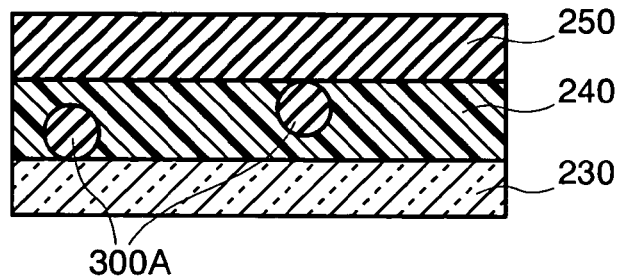
FIGS. 4A to 4D are plan views of a stacked film containing foreign matter in an organic EL display.
Figure 4B:
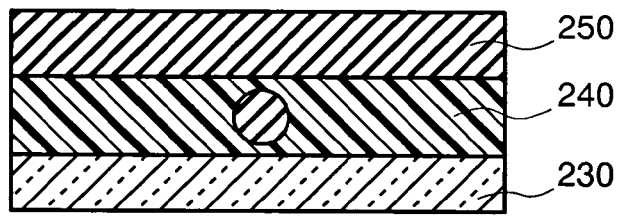

FIG. 4A shows conductive foreign matter 300A in contact with one of the first electrode 230 and the second electrode 250. FIG. 4B shows electroconductive foreign matter 300B not in contact with any of the first electrode 230 or the second electrode 250. In a case where such foreign matter 300A or 300B is contained in the thin organic film 240, the effective distance between the first electrode 230 and the second electrode 250 is narrowed at the position of the foreign matter 300A or 300B. Therefore, when a voltage is applied between the electrodes 230 and 250, a current leak path may possibly be formed at the position of the foreign matter 300A or 300B.

Figure 4C:
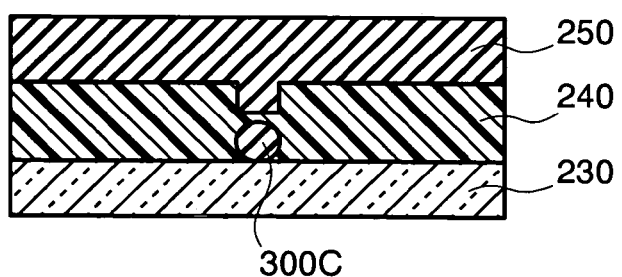

FIG. 4C shows a case in which the thickness of the thin organic EL film 240 is locally reduced by the presence of the foreign matter 300C. In this case, the distance between the first electrode 230 and the second electrode 250 is narrowed at a portion where the thickness of the thin organic EL film 240 is reduced. Accordingly, a current leak path may possibly be formed at the position of the foreign matter 300C irrespective of whether the foreign matter 300C is electroconductive or not.

Figure 4D:
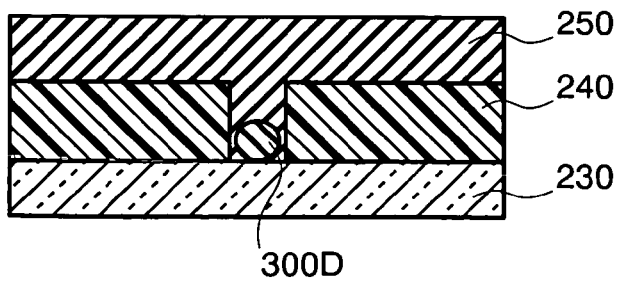

FIG. 4D shows a case in which a defect is formed in the thin organic EL film 240 by the presence of the foreign matter 300D. In this case, the first electrode 230 and the second electrode 250 are short-circuited at the defective portion of the thin organic EL film 240. Accordingly, a current leak path is formed at the position of the foreign matter 300 irrespective of whether the foreign matter 300D is electroconductive or not.

Also for the foreign matters 300A to 300D referred to herein as the specific examples, the pixel restoration by laser according to this embodiment is also effective. That is, formation of the current leak path between the first electrode 230 and the second electrode 250 can be prevented by isolating the second electrode 250 into an island-like region larger than the outer shape of the foreign matter 300A to 300D (cross section of the foreign matter along the in-plane direction of the second electrode) and other region (region functioning as the second electrode of the restored pixel) by irradiating with a laser beam a band-like region surrounding the outer profile of the foreign matter 300A to 300D of the observed from the side of the surface 210b of the glass substrate 210.

To confirm the effects (2), (3) in those described above, a comparative experiment was conducted by using the following three types of samples.

(a) Sample 1

Normally lit organic EL display device.

(b) Sample 2

An organic EL display device manufactured by manufacturing steps according to this embodiment. The device in which pixel defects caused by stainless steel type foreign matter (about 10 μm diameter) containing Fe, Ni, Cr, etc. are restored in the manufacturing steps.

(c) Sample 3

Organic EL display device in which the same foreign matter as that of Sample 2 was present in the thin organic EL film and, accordingly, the pixel defect was restored by directly irradiating the foreign matter region with a laser beam.

Figure 8:
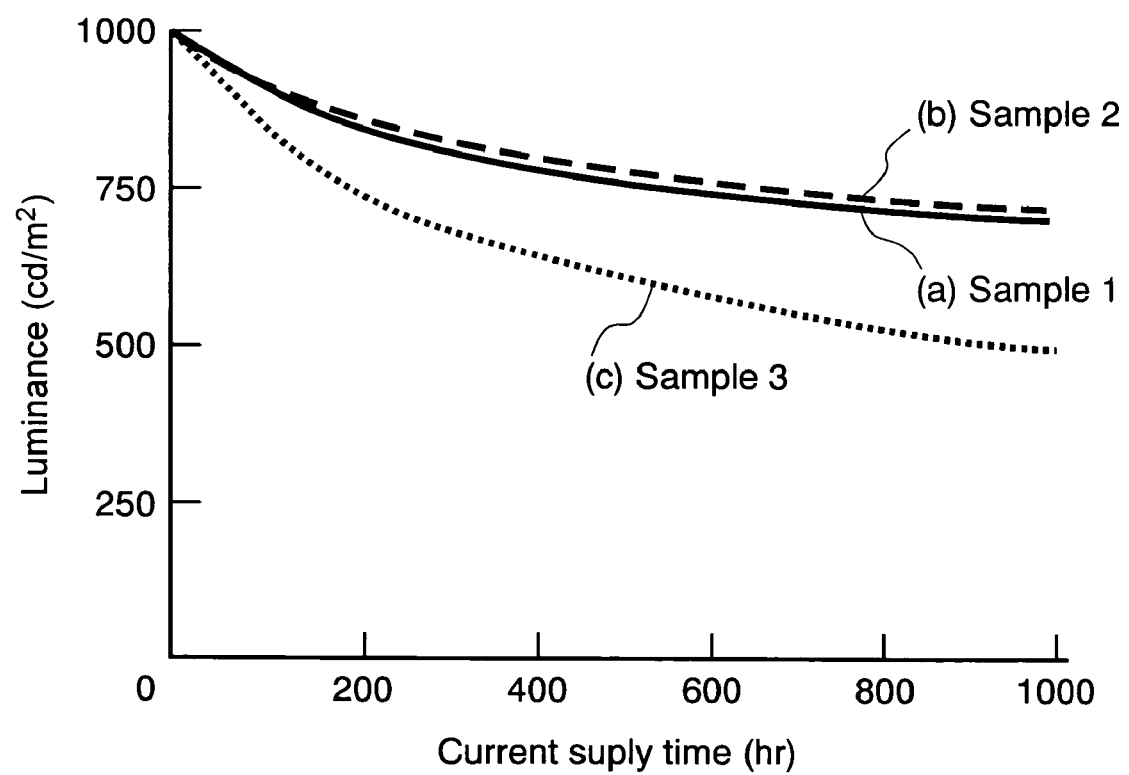
FIG. 8 is a graph showing a relation between the luminance and the current supply time in terms of pixels after restoration according to the embodiment of the invention and a comparative pixel.

For the samples 1 to 3, a continuous current supply test was conducted with a DC current with the initial luminance being set at 1000 cd/m$^2$ and the change of the luminance in the course of the test was measured. The result is shown in FIG. 8.

It was found that the luminance of Sample 2 lowered moderately about at the same rate as the luminance of Sample 1, whereas the luminance of Sample 3 lowers abruptly just after starting the current supply since the foreign matter irradiated with laser constitutes a contamination source. For Sample 3, it was also found that the half-decay time of the luminance was extremely shorter than that of Sample 1 or 2.

Further, in the treatment for restoring the pixel defect of Sample 2, the laser irradiated region in the second electrode could be removed smoothly by the laser irradiation once, whereas the laser beam was absorbed by the stainless steel series foreign matter in the treatment for restoring the pixel defect of Sample 3 and the laser irradiated region in the second electrode could not be removed completely by the irradiation of the laser beam once. Therefore, it was necessary to irradiate the identical region with the laser beam three times.

From the result described above, it was confirmed that the foregoing effect could be obtained for the organic EL display to be a product by the manufacturing steps according to this embodiment.

In the embodiment, the rectangular band-like region 310 surrounding the foreign matter 300 is removed from the second electrode 250; however, the region to be removed from the second electrode may be any other shape so long as it is a shape easy for laser fabrication. For example, the region to be removed from the second electrode may also be a band-like or annular region along the profile of a polygonal shape other than the rectangular shape (refer to FIG. 6B), or a band-like region of a shape along the outer profile of the foreign matter 300 (refer to FIG. 6C).

Further, a laser beam M shaped into a rectangular form is irradiated several times; however, the laser beam M may be incident on the surface 210b of the glass substrate 210 in any manner so long as the contact region 250a with the foreign matters 300 can be isolated from the second electrode 250.

Figure 6A:
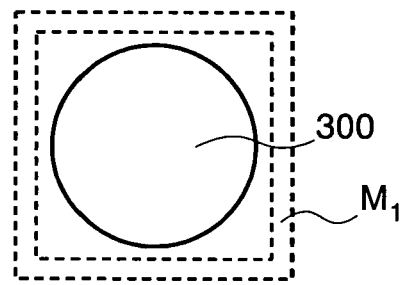
FIGS. 6A, 6B and 6C are diagrams showing examples of the shape of an irradiation region of a laser beam usable in the pixel restoring treatment according to the embodiment of the invention.

For example, as shown in FIG. 6A, a rectangular frame-like region 310 surrounding foreign matter 300 may be removed all at once from the second electrode 250 by irradiating once the surface 210b of the glass substrate 210 with a laser beam $M_1$ shaped to a rectangular frame-like form of a size in accordance with the size of the foreign matter 300 through an optical system such as a slit.

Figure 6B:
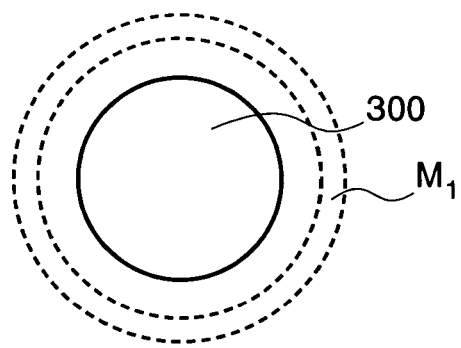

Further, as shown in FIG. 6B, a laser beam $M_1$ shaped to an annular form of a diameter in accordance with the size of the foreign matter 300 may be irradiated only for once to the surface 210b of the glass substrate 210 through an optical system such as a slit.

Figure 6C:
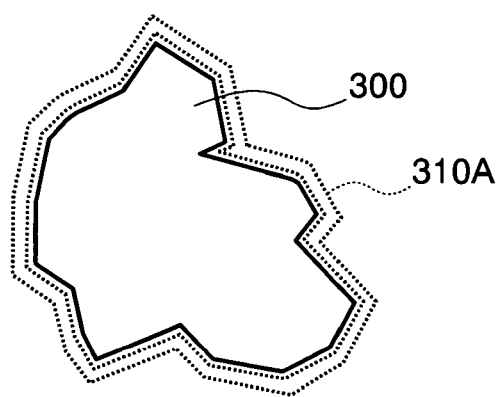

Further, as shown in FIG. 6C, a band-like region 310A along the outer shape of the foreign matter 300 may also be removed from the second electrode 250 by scanning a laser spot light along the outer shape of the foreign matter 300 within the surface 210b of the glass substrate 210.

By the way, the manufacturing conditions in the manufacturing steps described above give effects on the quality of the organic EL display as a completed product. Preferred manufacturing conditions are to be described below.

First, a description will be made of the shape and size for the region 310 to be removed from the second electrode.

Since the region 310 to be removed from the second electrode and a region surrounded therewith constitute a non-emission region in the thin organic EL film 240, the size of the region 310 to be removed from the second electrode gives an effect on user's visual sense. Then, to confirm the effect, a lighting test for pixels after restoration having the shape and size of the region 310 to be removed from the second electrode different from each other was conducted in the front elevational view from a predetermined distance.

As a result, in a case where the region 310 to be removed from the second electrode was of a rectangular frame like form of about 50 μm×about 50 μm (area of the region 310 to be removed from the second electrode and a region surrounded therewith, that is, the area of non-emission region of about 2500 μm$^2$), it gives no sense of discomfort to a user with naked eyes. However, in a case where the region 310 to be removed from the second electrode was a rectangular frame-like form of a greater size, for example, it was a rectangular frame-like form of 80 μm×80 μm (area of the non-emission region of about 6400 μm$^2$), the user could recognize the non-emission region as a black spot.

Further, in a case where the region 310 to be removed from the second electrode had an annular shape with an outer diameter of about 60 μm (area for the non-emission region of about 2827 μm$^2$), it gave no sense of discomfort to the user with naked eyes. However, in a case where the region 310 to be removed from the second electrode was an annular shape with an outer diameter of about 80 μm (area of non-emission region of 5026 μm$^2$), the user could recognize the non-emission region as a black spot with naked eyes.

In view of the foregoing, it was confirmed that the size of the region 310 to be removed from the second electrode gave an effect on the visual sense of the user and it is preferred to determine the shape and size of the region 310 to be removed from the second electrode so that the area of the non-emission region is 2500 μm$^2$ or less in order to enable the display to be shipped as actual products.

Next, the effect given by the wavelength of the laser beam M used for restoration of the pixel is to be described.

As has been described above, it is preferred that the laser beam M used for the restoration of the pixel has a wavelength showing high transmittance for the material used to form the thin organic EL film 240. This is because the laser beam M is irradiated from the side of the glass substrate 110 and reaches an object to be cut (second electrode 250) after transmitting the driving circuit layer 220, the first electrode 230 and the thin organic EL film 240. In addition, accordingly, if it is absorbed greatly in the thin organic EL film 240, not only the laser beam does not reach the second electrode 250, but also the thin organic EL film 240 is melted by heat and the heat diffuses also in the in-plane direction of the substrate. Thus, possibly failing to obtain a desired fabrication shape.

Then, to examine the relationship between the material for forming the thin organic EL film 240 and the wavelength of the laser beam M, thin organic EL films having absorbing characteristics different from each other were prepared and the second electrode in contact with the thin organic EL films were put to cutting fabrication by laser beams at wavelengths different from each other.

In this case, second electrodes of pixels are used as objects to be cut by the three types of laser beams. The second electrodes of pixels have thin organic EL films formed of three types of light emitting materials showing absorption spectrum in FIG. 9 (blue light emitting material, green light emitting material and red light emitting material). The three types of laser beams are obtained from Nd: YAG lasers (ultraviolet rays at a wavelength of 355 nm, a visible light (green) at a wavelength of 532 nm, near infrared light at a wavelength of 1064 nm). The absorbance shown in the drawings is a product of the film thickness of the thin organic EL film and the absorption coefficient of the thin organic EL film at each wavelength.

Figure 9A:
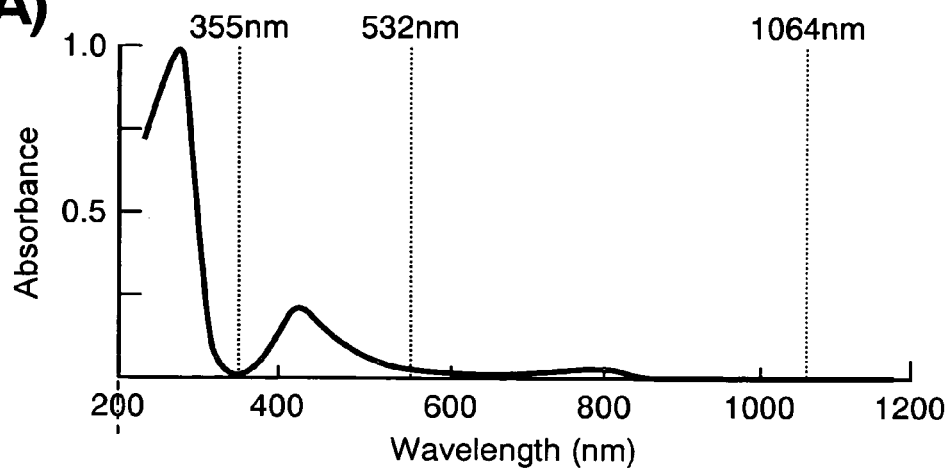
FIGS. 9A, 9B and 9C show absorption spectral charts of materials forming a thin organic EL film.
Figure 9B:
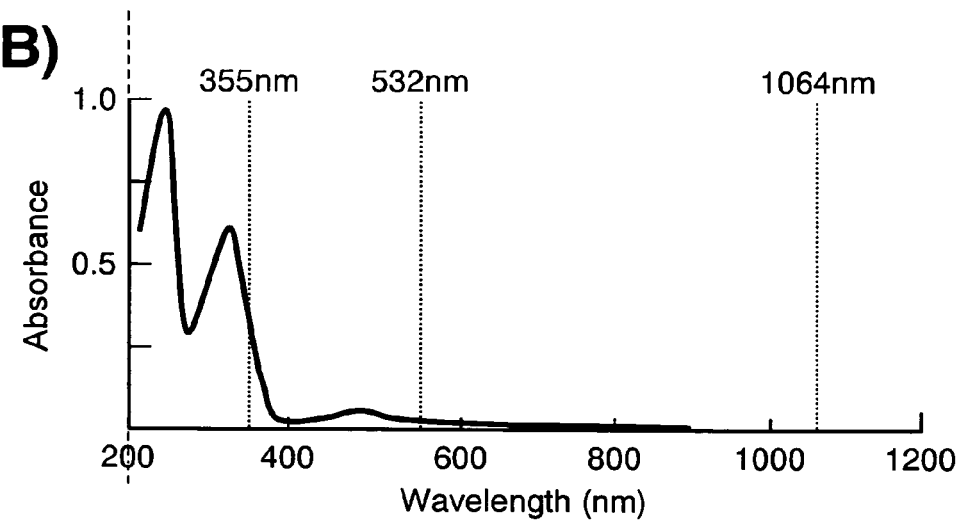

As shown in FIG. 9A, the absorbance of each of the three types of laser beams shows a value of 0.1 or less for the blue light emitting material. Further, as shown in FIG. 9B, for the green light emitting material, the absorbance of the laser beam with a wavelength of 532 nm and a wavelength of 1064 nm each shows a value of 0.1 or less, whereas the absorbance of the laser beam with a wavelength of 355 nm shows a value of about 0.25, among three types of the laser beams.

Figure 9C:
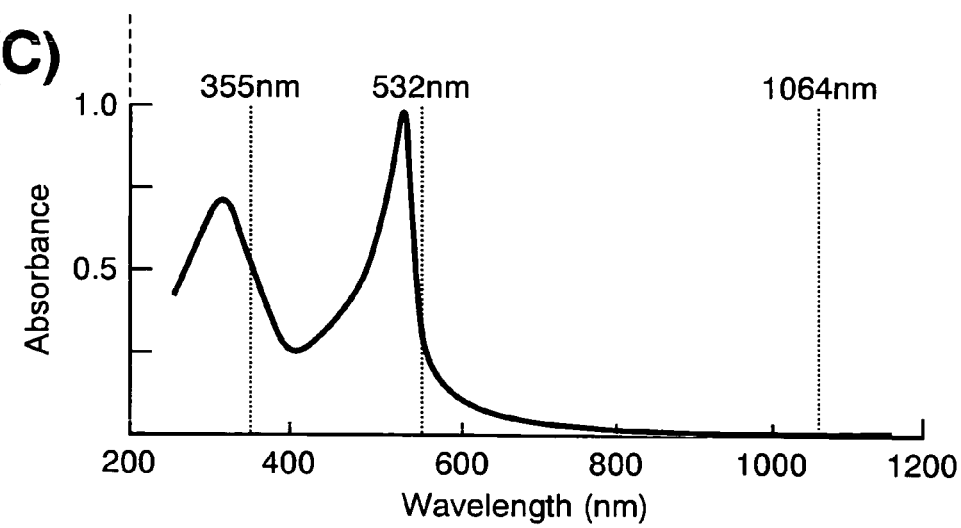

Further, as shown in FIG. 9C, for the red light emitting material, the absorbance of the laser beam with a wavelength of 1064 nm, shows a value of 0.1 or less, whereas the absorbance of the laser beams at a wavelength of 355 nm and at a wavelength of 532 nm respectively shows values of about 0.5 and about 0.4, among the three types of region light.

As a result of microscopic observation for the cut portion of each second electrode, the followings were confirmed for each of the light emitting materials.

Figure 10A:
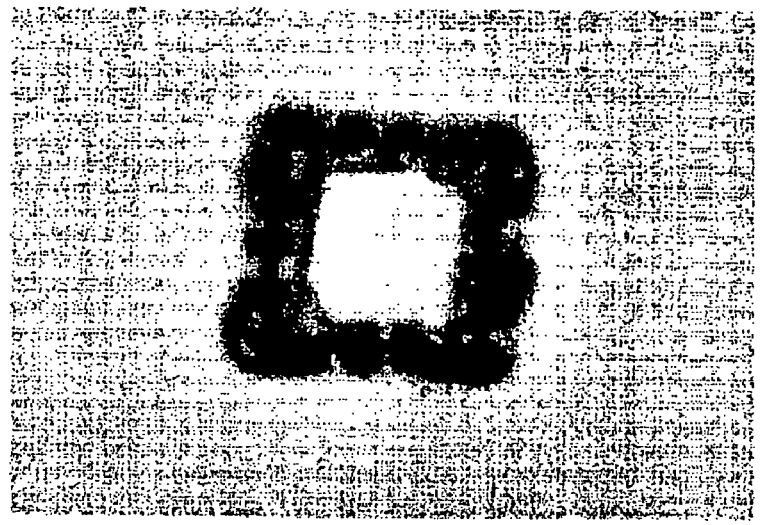
FIGS. 10A and 10B are views for comparing optical microscopic photographs showing the difference in the fabrication characteristics of a thin organic EL film depending on the difference in the wavelength of the laser beam used for the pixel restoration.
Figure 10B:
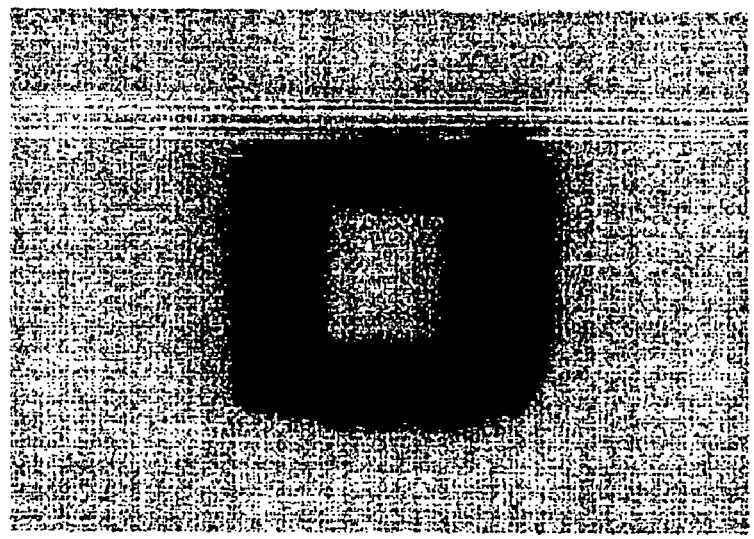

For the pixel having an thin organic EL film formed of the green light emitting material, as shown in FIG. 10B, the second electrode was cut favorably by the irradiation of a laser beam with a wavelength of 532 nm showing the absorbance, to the green light emitting material, of 0.1 or less and also the thin organic EL film was scarcely melted. The same result was obtained also in the irradiation of a laser beam with a wavelength of 1064 nm showing the absorbance, to the green light emitting material, of 0.1 or less.

On the contrary, as shown in FIG. 10A, the second electrode could not be cut completely by the irradiation of a laser beam with a wavelength of 355 nm showing the absorbance, to the green light emitting material, of about 0.25.

Further, for the pixel having a thin organic EL film of a red emission material, the second electrode could be favorably by the irradiation of a laser beam with a wavelength of 1064 nm showing an absorbance, to the red emission material, of 0.1 or less and also the thin organic EL film was scarcely melted. On the contrary, the second electrode could not be cut completely by the irradiation of a laser beam with a wavelength of 355 nm showing the absorbance, to the red emission material, of about 0.5 and by the irradiation of a laser beam with a wavelength of 532 nm showing the absorbance, to the red light emitting material, of about 0.4.

Further, for the pixel having an thin organic EL film formed of a blue emission material, the second electrode was cut favorably and also the thin organic EL film was scarcely melted by the irradiation of each of laser beams at the wavelengths of 355 nm, 532 nm and 1064 nm showing an absorbance, to the blue light emitting material, of 0.1 or less.

In view of the foregoings, it can be seen that the second electrode can be efficiently cut to a desired shape since the laser beam causes less absorption to the thin organic EL film so long as it has a wavelength showing an absorbance at a value of 0.1 or less to the material for forming the thin organic EL film. That is, it is confirmed that the second electrode can be cut favorably and efficiently without melting the thin organic EL film by selecting the wavelength of the laser beam used for the restoration of pixels in accordance with the material for forming thin organic EL film.

Among the wavelengths of 355 nm, 532 nm and 1064 nm, since the laser beam with the longest wavelength (1064 nm) gives a favorable result of fabrication to each of the light emitting materials, a laser beam with a wavelength of 1064 nm may be used generally for the restoration of pixels having thin organic EL films formed of the three kinds of light emitting materials described above. Further, since a laser beam with a shorter wavelength can reduce its diameter smaller, a laser beam with the shortest wavelength may be selected from laser beams at wavelengths providing favolable result of fabrication in a case where the size of the foreign matter is relatively larger in order to reduce the not-lit region of the pixel after restoration.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications as fall within the ambit of the appended claims.

What is claimed is:

1. A method for manufacturing an organic electroluminescence display having an organic film and first and second electrode layers, the first and second electrode layers facing each other to interpose the organic film therebetween and allow the organic film to emit light passing through the first electrode layer, said method comprising the steps of:

inspecting whether the organic film emits light or not;
if the organic film does not emit light, detecting foreign matter in the organic film from a side of the first electrode layer; and
if the foreign matter is detected, irradiating the second electrode layer with a laser beam capable of transmitting the first electrode layer and the organic film by way of an optical path free of the foreign matter, so as to remove a closed band-like region of the second electrode layer surrounding a periphery of the foreign matter from the second electrode layer,
wherein an island region of the second electrode layer is isolated from a remaining region of the second electrode layer by an area of the organic film being exposed by removing the closed band-like region of the second electrode layer, and the foreign matter exists under the island region in the organic film.

2. The method according to claim 1, wherein the laser beam is emitted such that a sum of an area of the closed band-like region of the second electrode layer irradiated therewith and the island region of the second electrode layer over the foreign matter is 2500 μm² or less.

3. The method according to claim 1, wherein
an outline of the closed band-like region of the second electrode layer has a rectangular frame like form of 50 μm×50 μm.

4. The method according to claim 1, wherein
the organic film is formed of either one of a blue emission material, a green emission material, and a red emission material, and
a wavelength of the laser beam irradiating the organic film therewith is set to 1064 nm.

5. A method for manufacturing an organic electroluminescence display having an organic film and first and second electrode layers, the first and second electrode layers facing each other to interpose the organic film therebetween and allow the organic film to emit light passing through the first electrode layer, said method comprising the steps of:

inspecting whether the organic film emits light or not;
if the organic film does not emit light, detecting foreign matter in the organic film from a side of the first electrode layer;
if the foreign matter is detected, irradiating the second electrode layer with a laser beam capable of transmitting the first electrode layer and the organic film from the first electrode layer by way of a path passing the outside of the foreign matter in the organic film; and
cutting a band-like region of the second electrode layer surrounding the outside of a first region thereof above the foreign matter, so as to isolate the a first region of the second electrode layer from a second region of the second electrode layer other than the first region thereof, the first region having larger cross section than a cross section of the foreign matter in view of the in-plane direction of the second electrode layer, wherein the first region of the second electrode layer remains on the organic film after the step of cutting the band-like region thereof.

6. The method according to claim 5, wherein the band-like region of the second electrode layer is cut by several irradiations of rectangular laser beams successively incident on rectangular regions along a rectangle in the second electrode layer, and the rectangle completes a closed profile surrounding the first region of the second electrode layer.

7. The method according to claim 5, wherein the band-like region of the second electrode layer is cut in an annular shape surrounding the first region of the second electrode layer completely.

8. A method for manufacturing an organic electroluminescence display having an organic film and first and second electrode layers, the first and second electrode layers facing each other to interpose the organic film therebetween and allow the organic film to emit light passing through the first electrode layer, said method comprising the steps of:
   detecting foreign matter in the organic film and in contact with the second electrode layer from a side of the first electrode layer;
   if the foreign matter is detected, irradiating the second electrode layer from the side of the first electrode layer with a laser beam capable of transmitting the first electrode layer and the organic film by way of a path spaced apart from the outside of the foreign matter in the organic film; and
   cutting a band-like region of the second electrode layer apart from surrounding a periphery of a first region thereof in contact with the foreign matter, so as to isolate the first region of the second electrode layer entirely from a second region of the second electrode layer other than the first region thereof,
   wherein the first region of the second electrode layer remains on the organic film after the step of cutting the band-like region thereof.

9. The method according to claim 8, wherein the first electrode layer, the organic film, and then the second electrode layer are stacked on a glass substrate, and the laser beam is incident on the glass substrate for irradiating the band-like region of the second electrode layer therewith.

10. The method according to claim 5, wherein the foreign matter in contact with the first region of the second electrode layer at a side thereof opposite to the first electrode layer is a conductive foreign matter, and the second region of the second electrode layer is not in contact with the conductive foreign matter.

* * * * *